United States Patent [19]

Füllmann et al.

[11] 4,195,306
[45] Mar. 25, 1980

[54] GATE TURN-OFF THYRISTOR

[75] Inventors: Marius Füllmann, Neu-Isenburg; Friedhelm Sawitzki, Frankfurt am Main; Dieter Silber, Hausen, all of Fed. Rep. of Germany

[73] Assignee: Licentia Patent-Verwaltungs-G.m.b.H., Frankfurt am Main, Fed. Rep. of Germany

[21] Appl. No.: 711,690

[22] Filed: Aug. 4, 1976

[30] Foreign Application Priority Data

Aug. 4, 1975 [DE] Fed. Rep. of Germany ...... 2534703

[51] Int. Cl.² .......................................... H01L 29/747
[52] U.S. Cl. ...................................... 357/38; 357/86; 357/90; 307/252 C
[58] Field of Search .................. 357/39, 38, 90, 86; 307/252 C

[56] References Cited

U.S. PATENT DOCUMENTS

| 3,408,545 | 10/1968 | De Cecco et al. | 357/38 |
| 3,590,346 | 6/1971 | Bilo et al. | 357/38 |
| 3,771,029 | 11/1973 | Burtscher et al. | 357/38 |
| 3,896,476 | 7/1975 | Kawakami | 357/38 |
| 3,967,294 | 6/1976 | Takase et al. | 357/38 |
| 4,040,170 | 8/1977 | Schlegel et al. | 357/38 |

FOREIGN PATENT DOCUMENTS 2431022  1/1975  Fed. Rep. of Germany ............ 357/38

OTHER PUBLICATIONS

E. Wolley et al., "Char. of a 200 AMP Gate Turn-Off Thyristor," IEEE Conf. Rec. of 1973 8th Ann. Meet. of the IEEE Indust. Appl. Soc., 73CHO763-31A, Oct. 8-Oct. 11, 1973, pp. 251-255.

Primary Examiner—Joseph E. Clawson, Jr.
Attorney, Agent, or Firm—Spencer & Kaye

[57] ABSTRACT

A gate turn-off thyristor device including a gate turn-off main thyristor and a gate turn-off auxiliary thyristor, each having an emitter, a control base, a main base and a counter-emitter, integrated in a semiconductor body including three zones of alternatingly opposite conductivity type. The three zones of the semiconductor body are each divided into two regions to provide the counter-emitter, main base and control base zones of the two thyristors, while the emitter zones of the main thyristor and of the auxiliary thyristor are separate zones formed in the respective associated regions constituting the control base zones of the respective thyristors. The two counter-emitter zones of the two thyristors are commonly contacted, and the two regions of at least one of the zones of the semiconductor body are doped differently so that the turn-off gain of the main thyristor is greater than the turn-off gain of the auxiliary thyristor and the holding current of the auxiliary thyristor is smaller than the holding current of the main thyristor.

13 Claims, 4 Drawing Figures

GATE TURN-OFF THYRISTOR

BACKGROUND OF THE INVENTION

The present invention relates to a gate turn-off thyristor having emitter, control base, main base and counter-emitter zones.

A thyristor is a semiconductor switch which permits the switching on of a load current by means of a relatively low control current. In normal thyristors switching off is effected in that the load current is lowered to below a minimum value, the so-called holding current. However, so-called gate turn-off thyristors are known in which switching off as well as switching on are effected via the control current, the control current being directed in the opposite direction for switching off than for switching on of the thyristor. The switch-off behavior is characterized by the turn-off gain which is defined as the ratio of the anode current to the required negative control current. In the presently known embodiments of gate turn-off thyristors, however, a relatively large control current, which typically is 10 to 30% of the load current carried by the thyristor in the switched on state is required for switching off the thyristor. In particular, a considerable forward voltage drop must be tolerated which amounts to several volts for a current load of several 10 A/cm$^2$. Furthermore, the holding current also becomes very high in such thyristors. Such devices are described, for example, in the U.S. Pat. No. 3,210,563 issued Oct. 5th, 1965 to T. C. T. New and in the Canadian Pat. No. 774,273 issued Dec. 1967 to Moyson et al.

A thyristor usually has four zones of alternatingly opposite conductivity type. The following terminology will be employed hereinafter for the individual zones of the thyristor: the conductive zone provided with the control terminal or terminals will be called the control base zone, the adjacent inner zone will be called the main base zone, the outer zone adjacent the control base zone will be called the emitter zone, and the outer zone adjacent the main base zone will be called the counter-emitter zone.

SUMMARY OF THE INVENTION

It is the object of the present invention to provide a gate turn-off thyristor device with good switching properties and with a low holding current. In particular, improved transmission behavior is simultaneously provided.

The above object is achieved according to the present invention in that in a gate turn-off thyristor device including a semiconductor body having three zones of alternatingly opposite conductivity type betwen the major surfaces thereof which constitute the control base, main base and counter-emitter zones respectively of a gate turn-off thyristor, and an emitter zone of a conductivity type opposite that of said control base zone formed in the control base zone at one of the major surfaces, the control base, main base and counter-emitter zones of the semiconductor body are each divided into first and second regions with the emitter zone being in the first region of the control base zone, whereby the emitter zone and the first regions of each of the control base, main base and counter-emitter zones constitute a main gate turn-off thyristor; a further emitter zone of a conductivity type opposite that of the control base zone is formed in the second region of the control base zone at the same major surface, whereby the further emitter zone and the second regions of each of the control base, main base and counter-emitter zones constitute an auxiliary gate turn-off thyristor; the first and second regions of the counter-emitter zone are provided with a common ohmic contact; and the first and second regions of at least one of the zones of the semiconductor body are differently doped to cause the turn-off gain of the main thyristor to be greater than the turn-off gain of the auxiliary thyristor and the holding current of the auxiliary thyristor to be smaller than the holding current of the main thyristor.

Advantageously the holding current of the auxiliary thyristor is smaller by at least a factor of 2 than the holding current of the main thyristor. The turn-off gain of the main thyristor should advantageously be greater than 5.

In the thyristor device according to the present invention a high turn-off gain is realized with simultaneously low holding current so that even with low load currents good stability of the thyristor is assured.

In the semiconductor thyristor device according to the present invention, the control current is fed to the control electrode of the auxiliary thyristor while the load current of the auxiliary thyristor is fed as a control current into the control electrode of the main thyristor. For switch-off the auxiliary thyristor receives a negative control current which is transferred, no later than after the auxiliary thyristor has been switched off via the gate cathode path of the latter, to the main thyristor and switches it off. This process is advantageously influenced when the breakdown voltage of the pn-junction formed between the emitter zone and the control base zone of the auxiliary thyristor is less than the breakthrough voltage of the corresponding pn-junction in the main thyristor.

In a preferred embodiment of the invention the thyristor is operated so that the auxiliary thyristor constantly feeds a control current to the main thyristor in the switched-on state in order to reduce the forward voltage drop of the main thyristor. In this case the main thyristor is designed so that its forward voltage drop can be reduced by feeding in a control current.

BRIEF DESCRIPTION OF THE PREFERRED EMBODIMENTS

Figure 1:
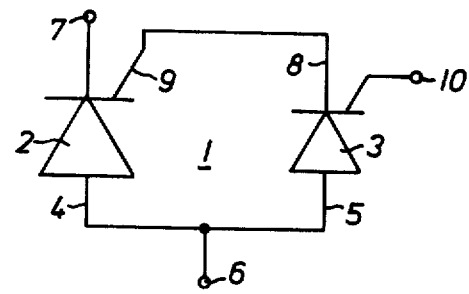
FIG. 1 shows the basic circuit arrangement of the gate turn-off thyristor according to the invention which includes two partial thyristor structures.

According to the basic schematic circuit diagram of FIG. 1, the gate turn-off thyristor 1 according to the invention basically includes a main thyristor 2 and an auxiliary thyristor 3 which as will be explained below are integrated into a common semiconductor body. The anode terminals 4 and 5 of the two thyristors are connected together and lead to a first load current terminal 6. The second load current terminal 7 is simultaneously the cathode electrode of the main thyristor 2. The cathode electrode 8 of the auxiliary thyristor 3 is connected with the control electrode 9 of the main thyristor 2. The actual control current for the thyristor device is fed in via the control electrode 10 of the auxiliary thyristor 3.

A circuit such as shown in FIG. 1 as well as in FIG. 3 which will be discussed below is disclosed in applicants' concurrently filed U.S. patent application Ser. No. 711,689 entitled *Semiconductor Switch With Thyristors*, the subject matter of which is incorporated herein. According to the present invention however, the circuit of FIG. 1 is formed in a single integrated circuit as shown schematically in FIG. 2.

Figure 2:
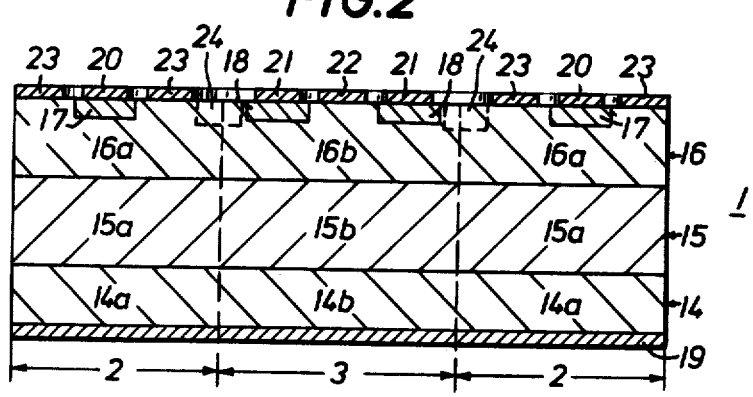
FIG. 2 is a schematic cross-sectional representation of the structure of a thyristor device according to the invention.

In the schematic and rotationally symmetrical design of a thyristor according to the invention as shown in FIG. 2, the two thyristors 2 and 3 of FIG. 1 are formed in a single semiconductor body, e.g., of silicon, which includes three adjacent zones of alternatingly opposite conductivity type, i.e., the counter-emitter zone 14, the main base zone 15 and control base zone 16. Each of the zones 14-16 is effectively divided into two regions 14a-16a and 14b-16b, respectively as indicated by the dashed lines in FIG. 2 which show the division of the thyristor 1 into main thyristor 2 and auxiliary thyristor 3. In order to complete the thyristors 2 and 3, emitter zones 17 and 18 for the main thyristor 2 and the auxiliary thyristor 3 respectively, which emitter zones 17 and 18 are of a conductivity type opposite that of the zone 16, are formed in the respective control base regions 16a and 16b at one major surface of the semiconductor body. Thus, while the control base regions 16a and 16b, the main base regions 15a and 15b, and the counter-emitter regions 14a and 14b of the main and auxiliary thyristors 2 and 3 respectively form continuous zones of the total thyristor 1, emitter zones 17 and 18 are separate and are inserted into the base control zone 16 of thyristor 1. The counter-emitter partial zones or regions 14a and 14b of the two partial thyristors 2 and 3 are contacted by a common ohmic contact 19 while the emitter zone 17 of the main thyristor 2 is provided with an ohmic contact 20 and the emitter zone 18 of the auxiliary thyristor 3 is provided with an ohmic contact 21. Moreover, an ohmic control contact 22 is provided for the control base region or partial zone 16b of the auxiliary thyristor 3 and an ohmic control contact 23 is provided for the control base region or partial zone 16a of the main thyristor 2. In the illustrated embodiment the emitter zones 17 and 18 of the two partial thyristors 2 and 3 as well as the two-part control electrode 23 of the main thyristor 2 are provided with a circular ring or annular shape and are disposed centrally symmetrically about the control electrode 22 of the auxiliary thyristor 3 which is designed as a circular surface.

As indicated above, at least one of the zones 14-16 is differently doped in its two regions 14a-16a and 14b-16b so that the turn-off gain of the main thyristor 2 is greater than the turn-off gain of the auxiliary thyristor 3 and the holding current of the auxiliary thyristor 3 is lower than the holding current of the main thyristor 2. Preferably the turn-off gain of the main thyristor 2 is at least 5, and the holding current of the auxiliary thyristor 3 is less than that of the main thyristor 2 by at least a factor of 2.

The above relationship between the main thyristor 2 and the auxiliary thyristor 3, i.e., the fact that the turn-off gain of the main thyristor 2 is greater than that of the auxiliary thyristor and the holding current of the main thyristor is greater than the holding current in the auxiliary thyristor, can be realized in that the emitter efficiency of the counter-emitter region 14b of the auxiliary thyristor 3 is larger than the emitter efficiency of the counter-emitter region 14a of the main thyristor 2. These ratios can be obtained in that the counter-emitter region or partial zone 14b of the auxiliary thyristor 3 is doped more heavily with the characteristic impurity with the use of known techniques, such as the masking technique, or is given a steeper doping profile than the region 14a which constitutes the counter-emitter zone of the partial main thyristor 2. The same conditions can also be obtained by selecting the concentration of the recombination centers in the main thyristor, and particularly in the main base region or partial zone 15a, to be greater than in the auxiliary thyristor. For this purpose gold or platinum doping can be used for the recombination centers in order to reduce the charge carrier lifetime. A different design of the emitter efficiency of the counter-emitter of the two partial thyristors 2 and 3 can also be combined with different degrees of doping concentration of the recombination centers.

The switch-off properties of the thyristor can also be improved by known measures which may simultaneously be used for the main thyristor 2 and the auxiliary thyristor 3. Thus it is favorable to select the transverse conductance of the base control zone to be sufficiently high. Moreover, the switch-off process is enhanced underneath the entire emitter surface if interdigitated structures are used in a known manner for the main and auxiliary thyristors. Inasmuch as such structures are required, FIG. 2 can of course only be considered to show a schematic structure for a thyristor 1 according to the invention.

If the auxiliary thyristor 3 has been fired by feeding a control current to the control electrode 10 of FIG. 1 (corresponding to contact 22 of FIG. 2), the cathode current of the auxiliary thyristor 3 is fed as a control current to the main thyristor 2 whereupon the latter is also brought into the conductive state. The normally relatively high forward voltage drop across the main thyristor 2 is significantly reduced in that the auxiliary thyristor 3 remains fired and feeds a control current to the main thyristor 2 during the entire switched-on or current conducting phase of the switch.

By introducing additional circuit components the switching properties of the thyristor device 1 according to the invention can be further improved. As shown in FIG. 3 a resistor 11 may be disposed in the circuit path between the cathode electrode 8 of the auxiliary thyristor 3 and the control electrode 9 of the main thyristor 2, i.e., between contacts 21 and 23 of FIG. 2. With this resistor 11 the load current distribution of the thyristor device 1 is made more favorable. As further shown in FIG. 3, preferably a diode 12 is disposed in parallel with resistor 11 and is polarized so that switch-off current of the control electrode 9 of the main thyristor 2 can be fed thereto at full amplitude, i.e., in the illustrated embodiment the anode of diode 12 is connected to the control electrode 9. Finally, as further shown in FIG. 3, a resistor 13 may be provided between the cathode 8 and the control electrode 10 of the auxiliary thyristor 3, i.e., between contacts 21 and 22 of FIG. 2. This resistor 13 improves the flow of the switch-off current and stabiles the entire arrangement against undesirable faulty firing. If necessary, this resistor 13 can also constitute an overload protection during switch-off for the auxiliary thyristor. The additional circuit components 11-13 may be provided as external circuitry for the thyristor device 1 or may be integrated into the semiconductor body.

Figure 3:
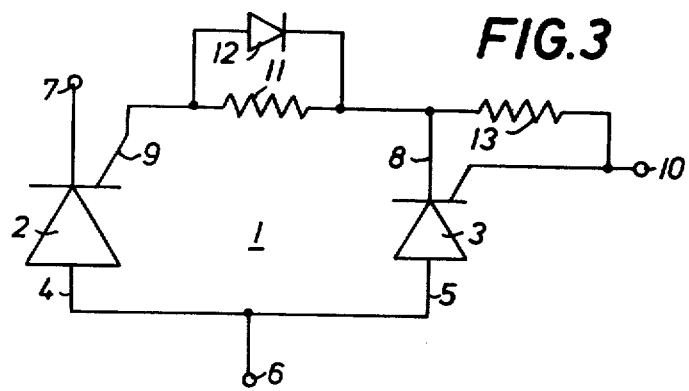
FIG. 3 shows an advantageous circuit modification for the two partial thyristors of the gate turn-off thyristor according to the invention.

The monolythical integration of both devices according to FIG. 2 causes an interaction between both thyristor systems via the control base transverse conductance which acts similarly to the ohmic shunt 13 shown in FIG. 3. This internal resistive shunt can be enhanced if necessary, by diminishing the transverse conductance of the control base in the space 24 between the contact metallizations 21 and 23.

Figure 4:
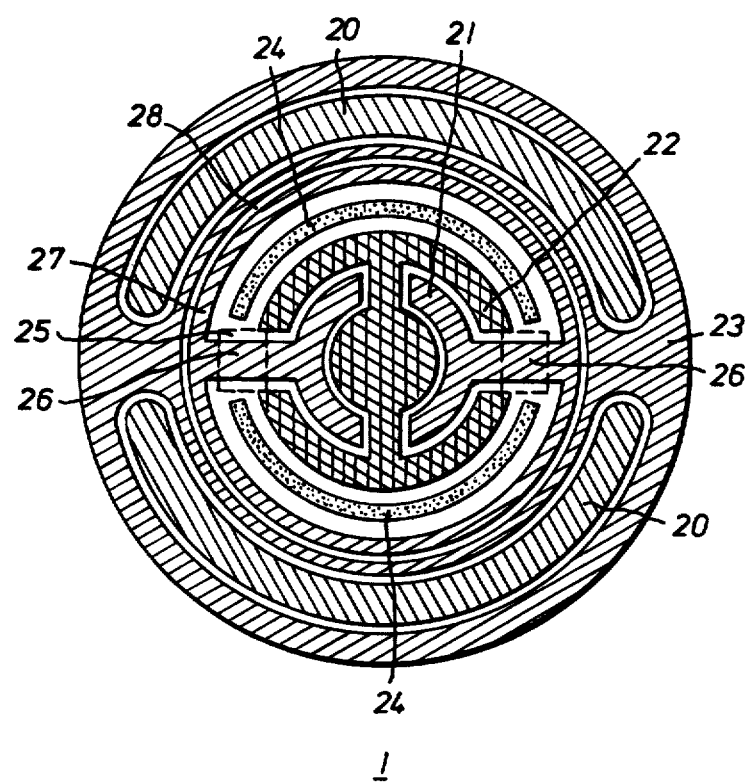
FIG. 4 shows a gate turn-off thyristor device with integrated connections between the thyristor systems being in the two different regions, according to the invention.

An example of a device with internal connections is shown in FIG. 4. It corresponds in many points to the simple concentric annular ring device shown in FIG. 2 (and the same numbers therefore mean equivalent objects), but the emitter zones 17 and their contact metallizations 23 are not completely closed rings in FIG. 4, so that the contact 23 forms a continuous area. Also the auxiliary thyristor emitter 18 and its metallizations are not coherent rings, and their gate metallizations 22 are formed as shown in FIG. 4.

Additionally, an integrated connection 26 to a further contact ring 27 on the control base 14a is provided, the space 28 between this contact ring and the control base contact 23 acts as an integrated resistor 11 shown in FIG. 3. To avoid direct contact of the connection 26 to the control base within the region of the auxiliary thyristor (which otherwise would act as an extremely low internal resistive shunt 13 in FIG. 3), the connections are isolated from the control base by an oxide layer 25. In the space between both thyristor system regions, the transverse conductance of the control base can be diminished by an etched area 24 as is shown in FIG. 2. By this measure, the internal resistive connections due to the control base transverse conductance (corresponding to the resistive shunt 13 in FIG. 3) can be adjusted to a suitable resistance value.

A specific example of a device as shown in FIG. 2 has the following properties and data:

The thickness of the emitter zones 17 and 18 is 10/$\mu$m. Their n+-doping is made by phosphorus diffusion; the surface doping concentration being in the $10^{20}$cm$^{-3}$ range. The control base 16 is p-type (by standard Gallium diffusion, 90/$\mu$m depth), its thickness being reduced by lapping and etching to be 38/$\mu$m below the emitter zone 17 and 40/$\mu$m below the emitter zone 18. The main base 15 is n-type, with $10^{14}$ cm$^{-3}$ doping concentration, and 150/$\mu$m thickness. The counter emitter 14 is p-type, its thickness is 30/$\mu$m, but it has different doping concentrations in the (a) and (b) regions: In the (a) regions, the doping is a relatively "flat" gallium diffusion profile which has been reduced from c. 90/$\mu$m thickness to c. 30/$\mu$m by lapping and etching (resulting in an emitter sheet resistivity of c. 400 $\Omega$ per square), but in the region (b), an additional masked p-type diffusion (boron) enhances the doping concentration gradient and the surface doping concentration (to lower the sheet resistivity to c. 80$\Omega$ per square).

The different recombination center concentrations are obtained by localized gold diffusion, the carrier lifetimes are 0.4/$\mu$s (average value) in zone 15a and 0.5 to 1/$\mu$s in zone 15b, corresponding to substitutional gold concentrations close to $10^{14}$cm$^{-3}$ in 15a and $5.10^{13}$cm$^{-3}$ (av. values) in 15b.

Due to the monolythic integration of both thyristors 2 and 3, there exist ohmic connections between the control base electrode of the auxiliary thyristor (terminal 10 in FIG. 1 or contact metallization 22) and the control base electrodes of the main thyristor (electrode 9 or contact metallizations 23) which, after connecting the devices electrically, acts as an ohmic shunt as does resistor 13 in FIG. 3. The zone 16 can be thinned (by etching) in the space 24 between both thyristor regions to avoid low internal resistance between both electrodes. After considerable etching (15 to 20/$\mu$m) the internal resistance is much enhanced (to above 100$\Omega$) and the external resistor 13 (which is 40$\Omega$ in our example) needs to be considered only. The auxiliary thyristor emitter has an emitter area of 4 mm$^2$; the emitter 17 of the main thyristor is a circular ring with 8 mm inner diameter and 8.6 mm outer diameter. With an external resistor 13 (40$\Omega$), an external resistor 11 (5$\Omega$) and a diode 12 as shown in FIG. 3, the device has the following properties:

|  | thyristor 2 | thyristor 3 | total switch acc. to FIG. 1 |
|---|---|---|---|
| turn-off gain (at load current) | 17 (4 A) | 9 (1 A) | 17 (4 A) |
| forward voltage drop (at 300 K, load current as above) | 9.5 V | 2 V | 4 V |
| holding current | 0.16 A | 0.03 A | 0.04 A |
| blocking voltage of the junction between cathode emitter and control base (electrodes 1 and 9, and electrodes 8 and 10 resp.) | 18 V | 14 V |  |

The turn-off gain is determined under the following conditions: Source voltage 100 V, devise temperature 300 K, total turn-off time 10$\mu$s.

It will be understood that the above description of the present invention is susceptible to various modifications, changes and adaptations, and the same are intended to be comprehended within the meaning and range of equivalents of the appended claims.

What is claimed is:

1. In a gate turn-off thyristor device including: a semiconductor body having three zones of alternatingly opposite conductivity type between the major surfaces thereof which constitute the control base, main base and counter-emitter zones respectively of a gate turn-off thyristor, and an emitter zone of a conductivity type opposite that of said control base zone formed in said control base zone at one of said major surfaces; said control base, main base and counter emitter zones of said semiconductor body being each divided into first and second regions with said emitter zone being in said first region of said control base zone, whereby said emitter zone and said first regions of each of said control base, main base and counter-emitter zones constitute a main gate turn-off thyristor; a further emitter zone of a conductivity type opposite that of said control base zone formed in said second region of said control base zone at said one major surface, whereby said further emitter zone and said second regions of each of said control base, main base and counter-emitter zones constitute an auxiliary gate turn-off thyristor; a common ohmic contact for said first and second regions of said counter-emitter zone; a respective ohmic contact on said one major surface for each of said first region of said control base zone, said second region of said control base zone, said emitter zone and said further emitter zone; and conductive means connecting said contact for said first region of said control base zone to said contact for said further emitter zone, whereby said contact for said first region of said control base zone and said common contact for both regions of said counter-emitter zone constitute the load current terminals of said thyristor device and said ohmic contact for said second region of said control base zone constitutes the control current input terminal of said thyristor device for turning same on and off; the improvement wherein: said first and second regions of at least one of said zones of said semiconductor body are differently doped to cause said auxiliary thyristor to have a turn-off gain and a holding current which are sufficiently less than the turn-off gain and the holding current respectively of said main thyristor so that said auxiliary thyristor will remain conducting during the current conducting switched-on state of said main thyristor and continuously feed a control current to said control electrode of said main thyristor to reduce the forward voltage drop of said main thyristor whereby the on-state behavior of said semiconductor switch is improved and the holding current of said semiconductor switch is reduced.

2. A thyristor device as defined in claim 1 wherein the turn-off gain of said main thyristor is greater than 5.

3. A thyristor device as defined in claim 2 wherein said holding current of said auxiliary thyristor is less than said holding current of said main thyristor by at least a factor of 2.

4. A thyristor device as defined in claim 1 wherein the breakdown voltage of the pn-junction formed by said further emitter zone and said second region of said control base zone is less than the breakdown voltage of the pn-junction formed between said emitter zone and said first region of said control base zone.

5. A thyristor device as defined in claim 4 wherein the doping concentration of the characteristic impurity of said second region of said control base zone adjacent said pn-junction formed by said second region of said control base zone and said further emitter zone is higher than the doping concentration of the characteristic impurity of said first region of said control base zone adjacent said pn-junction formed by said first region of said control base zone and said emitter zone.

6. A thyristor device as defined in claim 1 wherein the emitter efficiency of said second region of said counter-emitter zone is higher than the corresponding emitter efficiency of said first region of said counter-emitter zone.

7. A thyristor device as defined in claim 6 wherein said second region of said counter-emitter zone is more heavily doped or has a higher maximum doping concentration of its characteristic impurity than said first region of said counter-emitter zone.

8. A thyristor device as defined in claim 6 wherein said second region of said counter-emitter zone has a steeper doping concentration profile than said first region of said counter-emitter zone.

9. A thyristor device as defined in claim 1 wherein said first region of said main base zone has a recombination center concentration which is greater than the recombination center concentration in said second region of said main base zone in order to decrease the lifetime of the charge carriers is said main thyristor.

10. A thyristor device as defined in claim 1 wherein said further emitter zone, which constitutes the cathode of said auxiliary thyristor, is connected with said first region of said control base zone, which constitutes the control electrode of said main thyristor, by means of an integrated connection.

11. A thyristor device as defined in claim 1 further comprising an ohmic resistor connected between said first region of said control base zone, which constitutes the control electrode of said main thyristor, and said further emitter zone, which constitutes the cathode of said auxiliary thyristor.

12. A thyristor device as defined in claim 11 further comprising a diode connected in parallel with said ohmic resistor with the anode of said diode being connected to said control electrode of said main thyristor.

13. A thyristor device as defined in claim 1 further comprising an ohmic resistor connected between said further emitter zone, which constitutes the cathode of said auxiliary thyristor, and said second region of said control base zone, which constitutes the control electrode of said auxiliary thyristor.

* * * * *